US011626851B2

(12) United States Patent
Kishimoto et al.

(10) Patent No.: US 11,626,851 B2
(45) Date of Patent: Apr. 11, 2023

(54) ACOUSTIC WAVE DEVICE, HIGH-FREQUENCY FRONT END CIRCUIT, COMMUNICATION DEVICE, AND METHOD FOR MANUFACTURING ACOUSTIC WAVE DEVICE

(71) Applicant: Murata Manufacturing Co., Ltd., Nagaokakyo (JP)

(72) Inventors: Yutaka Kishimoto, Nagaokakyo (JP); Seiji Kai, Nagaokakyo (JP); Makoto Sawamura, Nagaokakyo (JP); Yuzo Kishi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 370 days.

(21) Appl. No.: 16/906,097

(22) Filed: Jun. 19, 2020

(65) Prior Publication Data
US 2020/0321933 A1    Oct. 8, 2020

Related U.S. Application Data

(63) Continuation of application No. PCT/JP2018/045213, filed on Dec. 10, 2018.

(30) Foreign Application Priority Data

Dec. 22, 2017    (JP) .............................. JP2017-245672

(51) Int. Cl.
*H03H 3/08*    (2006.01)
*H01L 41/338*    (2013.01)
(Continued)

(52) U.S. Cl.
CPC ............. *H03H 3/08* (2013.01); *H01L 41/338* (2013.01); *H03F 3/21* (2013.01);
(Continued)

(58) Field of Classification Search
CPC ...... H03H 3/08; H03H 9/02866; H03H 9/059; H03H 9/1092; H03H 9/145; H03H 9/25;
(Continued)

(56) References Cited

U.S. PATENT DOCUMENTS

2006/0055013 A1   3/2006   Ito et al.
2018/0123565 A1   5/2018   Takamine
2019/0068155 A1   2/2019   Kimura et al.

FOREIGN PATENT DOCUMENTS

JP    2005-295363 A    10/2005
JP    2006-109400 A    4/2006
(Continued)

OTHER PUBLICATIONS

Coufal et al., Precision measurement of the surface acoustic wave velocity on silicon single crystals using optical excitation and detection, The Journal of the Acoustical Society of America 95, 1158 (1994); doi: 10.1121/1.408473 (Year: 1994).*
(Continued)

*Primary Examiner* — Hafizur Rahman
(74) *Attorney, Agent, or Firm* — Keating & Bennett, LLP

(57) ABSTRACT

An acoustic wave device includes a piezoelectric substrate including a support substrate and a piezoelectric layer on the support substrate, the piezoelectric substrate including a first principal surface on the piezoelectric layer side, and a second principal surface on the support substrate side, an IDT electrode on the first principal surface, a support layer on the support substrate, a cover on the support layer, a through-via electrode provided through the support substrate and electrically connected to the IDT electrode, a first wiring electrode on the second principal surface of the piezoelectric substrate and electrically connected to the through-via electrode, and a protective film on the second principal surface to cover at least a portion of the first wiring electrode. The protective film is provided on an inner side of the support
(Continued)

layer when viewed in a direction normal or substantially normal to the second principal surface.

20 Claims, 6 Drawing Sheets

(51) Int. Cl.
- *H03F 3/21* (2006.01)
- *H03H 9/02* (2006.01)
- *H03H 9/05* (2006.01)
- *H03H 9/10* (2006.01)
- *H03H 9/145* (2006.01)
- *H03H 9/25* (2006.01)
- *H04B 1/40* (2015.01)

(52) U.S. Cl.
 CPC ........ *H03H 9/02866* (2013.01); *H03H 9/059* (2013.01); *H03H 9/1092* (2013.01); *H03H 9/145* (2013.01); *H03H 9/25* (2013.01); *H04B 1/40* (2013.01); *H03F 2200/451* (2013.01)

(58) Field of Classification Search
 CPC ... H01L 41/338; H03F 3/21; H03F 2200/451; H04B 1/40
 USPC ...................................................... 310/313 B
 See application file for complete search history.

(56) References Cited

FOREIGN PATENT DOCUMENTS

| | | |
|---|---|---|
| JP | 2011-160476 A | 8/2011 |
| WO | 2016/208677 A1 | 12/2016 |
| WO | 2017/212774 A1 | 12/2017 |

OTHER PUBLICATIONS

Holm et al., "Investigation of surface acoustic waves on LiNbO3, quartz, and LiTaO3 by laser probing", Elsevier, Microelectronic Engineering vol. 31, Issues 1-4, Feb. 1996, pp. 123-127 (Year: 1996).*

Official Communication issued in International Patent Application No. PCT/JP2018/045213, dated Feb. 19, 2019.

* cited by examiner

ACOUSTIC WAVE DEVICE, HIGH-FREQUENCY FRONT END CIRCUIT, COMMUNICATION DEVICE, AND METHOD FOR MANUFACTURING ACOUSTIC WAVE DEVICE

CROSS REFERENCE TO RELATED APPLICATIONS

This application claims the benefit of priority to Japanese Patent Application No. 2017-245672 filed on Dec. 22, 2017 and is a Continuation Application of PCT Application No. PCT/JP2018/045213 filed on Dec. 10, 2018. The entire contents of each application are hereby incorporated herein by reference.

BACKGROUND OF THE INVENTION

1. Field of the Invention

The present invention relates to an acoustic wave device, a high-frequency front end circuit, a communication device, and a method for manufacturing the acoustic wave device.

2. Description of the Related Art

Acoustic wave devices are widely used as, for example, filters of mobile phones. Japanese Unexamined Patent Application Publication No. 2011-160476 discloses an example of a surface acoustic wave device. In the surface acoustic wave device, a surface acoustic wave element is provided on a first surface of a semiconductor substrate. An adhesive layer is provided on the first surface to surround the surface acoustic wave element. A sealing member is provided on the adhesive layer. Wires are provided on a second surface of the semiconductor substrate. The wires are covered with an insulating layer.

The surface acoustic wave device is obtained by providing a plurality of surface acoustic wave elements on the semiconductor substrate and then cutting the semiconductor substrate into individual pieces with a dicing machine.

In Japanese Unexamined Patent Application Publication No. 2011-160476, a support member serving as the adhesive layer and a protective film serving as the insulating layer overlap each other in plan view. When a portion including the protective film is cut with the dicing machine, the portion to be cut is thick because of the protective film. Therefore, a long time is required for cutting. For example, when a dicing blade is used for cutting, the dicing blade may be clogged easily. Thus, it is preferable to cut a portion other than the protective film.

To cut a portion other than the protective film with the dicing machine, the cutting position may be set at a gap between protective films of adjacent acoustic wave elements. However, the actual cutting position varies, and it is therefore difficult to cut a portion other than the protective film. Thus, it is difficult to securely increase productivity.

If the distance between support members surrounding adjacent unseparated acoustic wave elements is increased, the number of acoustic wave elements that can be provided on the substrate decreases and the productivity decreases.

SUMMARY OF THE INVENTION

Preferred embodiments of the present invention provide acoustic wave devices, high-frequency front end circuits, communication devices, and methods for manufacturing acoustic wave devices, in each of which productivity is able to be significantly increased.

An acoustic wave device according to a preferred embodiment of the present invention includes a piezoelectric substrate including a support substrate and a piezoelectric layer directly or indirectly provided on the support substrate, the piezoelectric substrate including a first principal surface, which is a principal surface on the piezoelectric layer side, and a second principal surface, which is a principal surface on the support substrate side, an interdigital transducer (IDT) electrode directly or indirectly provided on the first principal surface of the piezoelectric substrate, a support layer provided on the support substrate to surround the IDT electrode when viewed in a direction normal or substantially normal to the first principal surface, a cover provided on the support layer, a through-via electrode provided through the support substrate and electrically connected to the IDT electrode, a first wiring electrode provided on the second principal surface of the piezoelectric substrate and electrically connected to the through-via electrode, and a protective film provided to cover at least a portion of the first wiring electrode. The protective film is provided on an inner side of the support layer so that the protective film does not overlap the support substrate when viewed in a direction normal or substantially normal to the second principal surface.

A high-frequency front end circuit according to a preferred embodiment of the present invention includes an acoustic wave device according to a preferred embodiment of the present invention, and a power amplifier.

A communication device according to a preferred embodiment of the present invention includes a high-frequency front end circuit according to a preferred embodiment of the present invention, and an RF signal processing circuit.

A method for manufacturing an acoustic wave device according to a preferred embodiment of the present invention is a method for manufacturing an acoustic wave device according to a preferred embodiment of the present invention. The method includes a step of preparing an acoustic wave device aggregate including an unseparated piezoelectric substrate, a plurality of the IDT electrodes, a plurality of the through-via electrodes, a plurality of the first wiring electrodes, a plurality of the protective films, an unseparated support layer provided on the unseparated piezoelectric substrate to surround the plurality of the IDT electrodes, and an unseparated cover provided on the unseparated support layer, and a step of separating the acoustic wave device aggregate into individual pieces by cutting the unseparated piezoelectric substrate, the unseparated support layer, and the unseparated cover with a dicing machine. The step of preparing the acoustic wave device aggregate includes providing the plurality of the protective films so that each of the protective films does not extend to a portion overlapping the unseparated support layer and is located on an inner side of the unseparated support layer when viewed in the direction normal or substantially normal to the second principal surface.

According to preferred embodiments of the present invention, the acoustic wave devices, the high-frequency front end circuits, the communication devices, and the methods for manufacturing the acoustic wave devices are each able to be provided, in each of which the productivity is able to be significantly increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention is disclosed below by describing preferred embodiments of the present invention with reference to the drawings.

The preferred embodiments described herein are illustrative and their components may partially be replaced or combined with those in different preferred embodiments.

Figure 1:
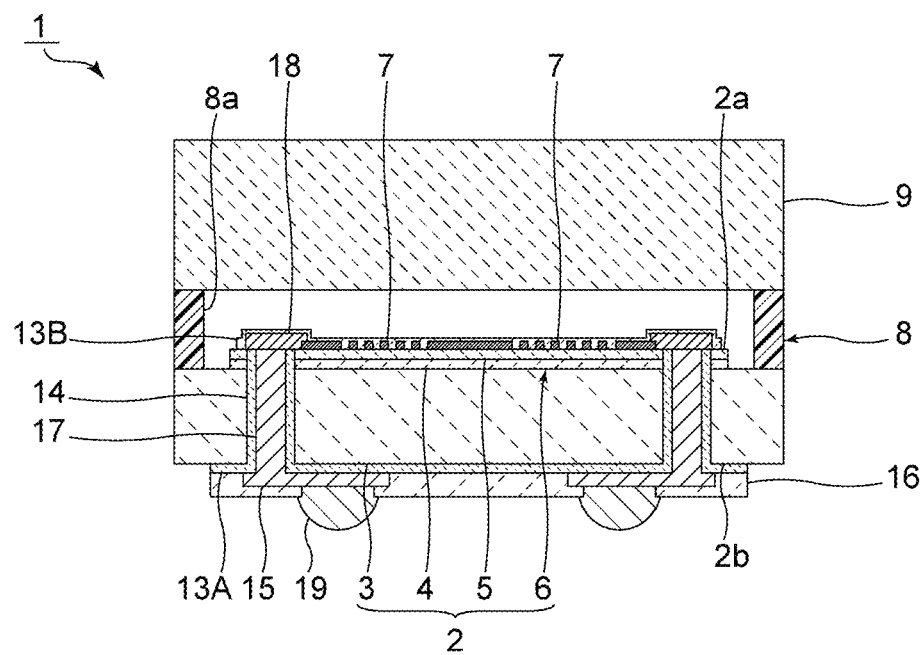
FIG. 1 is an elevational cross-sectional view of an acoustic wave device according to a first preferred embodiment of the present invention.

FIG. 1 is an elevational cross-sectional view of an acoustic wave device according to a first preferred embodiment of the present invention.

An acoustic wave device 1 includes a piezoelectric substrate 2. The piezoelectric substrate 2 includes a support substrate 3 and a piezoelectric layer 5. More specifically, a low acoustic velocity layer 4 is provided on the support substrate 3. The piezoelectric layer 5 is provided on the low acoustic velocity layer 4. Thus, the piezoelectric substrate 2 of the first preferred embodiment is a multilayer body in which the support substrate 3, the low acoustic velocity layer 4, and the piezoelectric layer 5 are stacked. The piezoelectric substrate 2 includes a first principal surface 2a as a principal surface on the piezoelectric layer 5 side, and a second principal surface 2b as a principal surface on the support substrate 3 side.

A plurality of interdigital transducer (IDT) electrodes are provided on the first principal surface 2a of the piezoelectric substrate 2. An acoustic wave is excited by applying an AC voltage to the IDT electrodes 7.

In the first preferred embodiment, the plurality of IDT electrodes 7 are directly provided on the first principal surface 2a of the piezoelectric substrate 2. The plurality of IDT electrodes 7 may indirectly be provided on the first principal surface 2a with, for example, a dielectric film provided therebetween.

The piezoelectric layer 5 may be made of any appropriate piezoelectric single crystal, for example, lithium tantalate or lithium niobate, or may be made of any appropriate piezoelectric ceramic, for example, ZnO, AlN, or PZT.

The low acoustic velocity layer 4 is a layer in which an acoustic velocity of a bulk wave propagating through the low acoustic velocity layer 4 is lower than an acoustic velocity of a bulk wave propagating through the piezoelectric layer 5. For example, the low acoustic velocity layer 4 is preferably made of a material including, as a main component, a compound provided by adding fluorine, carbon, or boron to glass, silicon oxynitride, tantalum oxide, or silicon oxide. The material for the low acoustic velocity layer 4 may be any material having a relatively low acoustic velocity. In the first preferred embodiment, the low acoustic velocity layer 4 is preferably made of silicon oxide, for example.

In the first preferred embodiment, the support substrate 3 is a high acoustic velocity layer in which an acoustic velocity of a bulk wave propagating through the support substrate 3 is higher than an acoustic velocity of an acoustic wave propagating through the piezoelectric layer 5. For example, the support substrate 3 may be made of a piezoelectric material, for example, aluminum nitride, aluminum oxide, silicon carbide, silicon nitride, silicon oxynitride, a DLC film, silicon (Si), sapphire, lithium tantalate, lithium niobate, or quartz, various ceramics, for example, alumina, zirconia, cordierite, mullite, steatite, or forsterite, diamond, magnesia, a material including any material described above as a main component, or a material including a mixture of any materials described above as a main component. The material for the high acoustic velocity layer may be any material having a relatively high acoustic velocity. In the first preferred embodiment, the support substrate 3 is preferably a silicon substrate, for example. The support substrate 3 need not be the high acoustic velocity layer.

The IDT electrode 7 may be a multilayer metal film in which a plurality of metal layers are stacked, or may be a single-layer metal film.

The acoustic wave device 1 includes the piezoelectric substrate 2 in which the support substrate 3 defining and functioning as the high acoustic velocity layer, the low acoustic velocity layer 4, and the piezoelectric layer 5 are stacked in this order. Thus, energy of the acoustic wave is able to effectively be trapped on the piezoelectric layer 5 side.

In the first preferred embodiment, the piezoelectric layer 5 is indirectly provided on the support substrate 3. The piezoelectric layer 5 may directly be provided on the support substrate 3.

A support layer 8 is provided on the support substrate 3 to surround the plurality of IDT electrodes 7 when viewed in a direction normal or substantially normal to the first principal surface 2a. More specifically, the support layer 8 includes a cavity 8a accommodating the plurality of IDT electrodes 7. The support layer 8 may be made of any appropriate resin.

A cover 9 is provided on the support layer 8 to seal the cavity 8a. In the first preferred embodiment, the cover 9 is preferably a silicon cover, for example. The cover 9 is not limited to the silicon cover and may be made of, for example, any appropriate resin. The shape of the cover 9 is not particularly limited but is preferably, for example, a plate shape in the first preferred embodiment.

The plurality of IDT electrodes 7 are provided in a hollow space surrounded by the support substrate 3, the support layer 8, and the cover 9. Thus, the acoustic wave device 1 has a WLP (Wafer Level Package) structure.

A first insulating layer 13A defining and functioning as an insulating layer is provided on the second principal surface 2b of the piezoelectric substrate 2. Through holes 14 are provided through the support substrate 3, the low acoustic velocity layer 4, and the piezoelectric layer 5. The first insulating layer 13A extends from the second principal surface 2b into the through holes 14.

First wiring electrodes 15 are indirectly provided on the second principal surface 2b with the first insulating layer 13A interposed therebetween. Second wiring electrodes 18 are provided on the piezoelectric layer 5. More specifically, the second wiring electrodes 18 are indirectly provided on the support substrate 3 with an intermediate layer 6, including the low acoustic velocity layer 4 and the piezoelectric layer 5, interposed between the second wiring electrodes 18 and the support substrate 3. The second wiring electrodes 18 are electrically connected to the IDT electrodes 7.

Through-via electrodes 17 are each provided in the through hole 14 so that one end is connected to the first wiring electrode 15 and the other end is connected to the second wiring electrode 18. The through-via electrode 17 is electrically connected to the IDT electrode 7 via the second wiring electrode 18. The first wiring electrode 15 and the second wiring electrode 18 may have electrode lands having wider widths than the other portions. Both ends of the through-via electrode 17 may be connected to the electrode lands of the first wiring electrode 15 and the second wiring electrode 18. In the first preferred embodiment, the through-via electrode 17 and the first wiring electrode 15 are integrated together. The through-via electrode 17 and the first wiring electrode 15 may be provided as separate components by including different materials.

As described above, the support substrate 3 of the first preferred embodiment is preferably made of, for example, silicon and therefore the electrical resistance of the support substrate 3 is lower than that of an insulator. The first insulating layer 13A is provided between the inner surface of the through hole 14 and the through-via electrode 17 and between the second principal surface 2b of the piezoelectric substrate 2 and the first wiring electrode 15. Thus, a leak current is able to be significantly reduced and therefore electrical characteristics of the acoustic wave device 1 hardly deteriorate. In addition, the intermediate layer 6 having insulating properties is provided on the support substrate 3 and the second wiring electrodes 18 are provided on the intermediate layer 6. Thus, the leak current is able to be further reduced and therefore the deterioration of the electrical characteristics of the acoustic wave device 1 is further significantly reduced or prevented.

If the support substrate 3 is made of an insulator, the first insulating the first 13A may be omitted.

In the present preferred embodiment, a second insulating layer 13B is provided on the piezoelectric layer 5 to cover the second wiring electrodes 18 and the IDT electrodes 7. Thus, the IDT electrodes 7 and the second wiring electrodes 18 are hardly damaged. The second insulating layer 13B may be omitted.

A protective film 16 is provided on the second principal surface 2b of the piezoelectric substrate 2 to cover at least a portion of each first wiring electrode 15. More specifically, the protective film 16 is provided on an inner side of the support layer 8 when viewed in a direction normal or substantially normal to the second principal surface 2b. In general, wiring electrodes facing outside in the acoustic wave device may particularly be damaged. In the first preferred embodiment, the first wiring electrodes 15 are hardly damaged by providing the protective film 16.

In the first preferred embodiment, the thickness of the protective film 16 is greater than the thickness of the first insulating layer 13A. Thus, the damage to the first wiring electrodes 15 is further significantly reduced or prevented. For example, the protective film 16 is preferably made of a polyimide. The protective film 16 may be made of a resin other than the polyimide or may be made of an inorganic insulator.

The first wiring electrode 15 includes a portion that is not covered with the protective film 16. A bump 19 is provided on the first wiring electrode 15 so that the bump 19 is joined to the portion that is not covered with the protective film 16. The plurality of IDT electrodes 7 are electrically connected to the outside via the second wiring electrodes 18, the through-via electrodes 17, the first wiring electrodes 15, and the bumps 19.

The acoustic wave device 1 of the first preferred embodiment includes the piezoelectric substrate 2 including the support substrate 3 and the piezoelectric layer 5 indirectly provided on the support substrate 3, the IDT electrodes 7 provided on the first principal surface 2a of the piezoelectric substrate 2, the support layer 8 provided on the support substrate 3 to surround the IDT electrodes 7 when viewed in the direction normal or substantially normal to the first principal surface 2a, the cover 9 provided on the support layer 8, the through-via electrodes provided through the support substrate 3 and electrically connected to the IDT electrodes 7, the first wiring electrodes 15 provided on the second principal surface 2b of the piezoelectric substrate 2 and electrically connected to the through-via electrodes 17, and the protective film 16 provided on the second principal surface 2b of the piezoelectric substrate 2 to cover at least a portion of each first wiring electrode 15. The acoustic wave device 1 has a structure in which the protective film 16 is provided on the inner side of the support layer 8 when viewed in the direction normal or substantially normal to the second principal surface 2b. Therefore, when an aggregate of acoustic wave devices is cut with a dicing machine, the protective film 16 is not cut even if the cutting position varies as long as a portion including an unseparated support layer is cut. Thus, a portion other than the protective film 16 is able to be cut easily and the productivity is able be significantly increased. This feature is described below together with a process to manufacture the acoustic wave device 1 according to the first preferred embodiment.

Figure 2A:
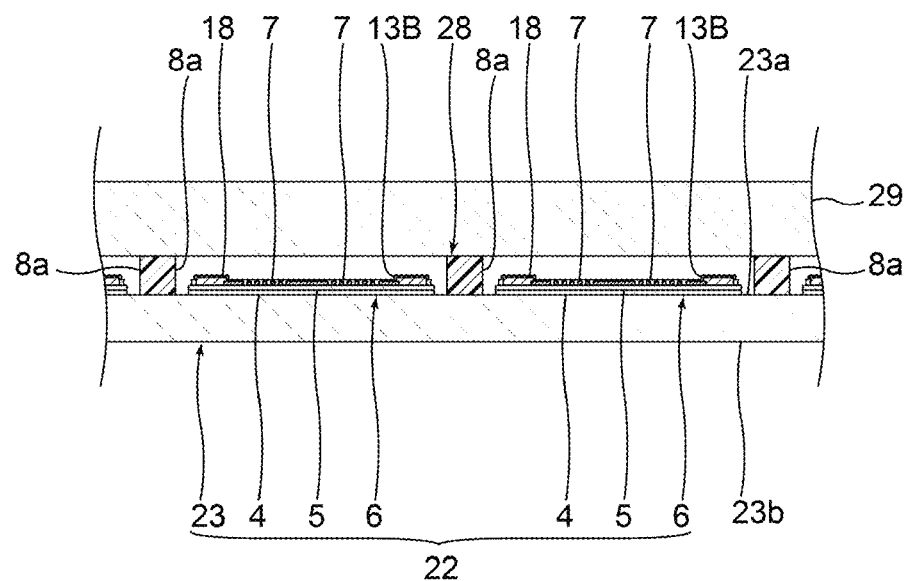
FIGS. 2A and 2B are elevational cross-sectional views showing an example of a method for manufacturing the acoustic wave device according to the first preferred embodiment of the present invention.
Figure 2B:
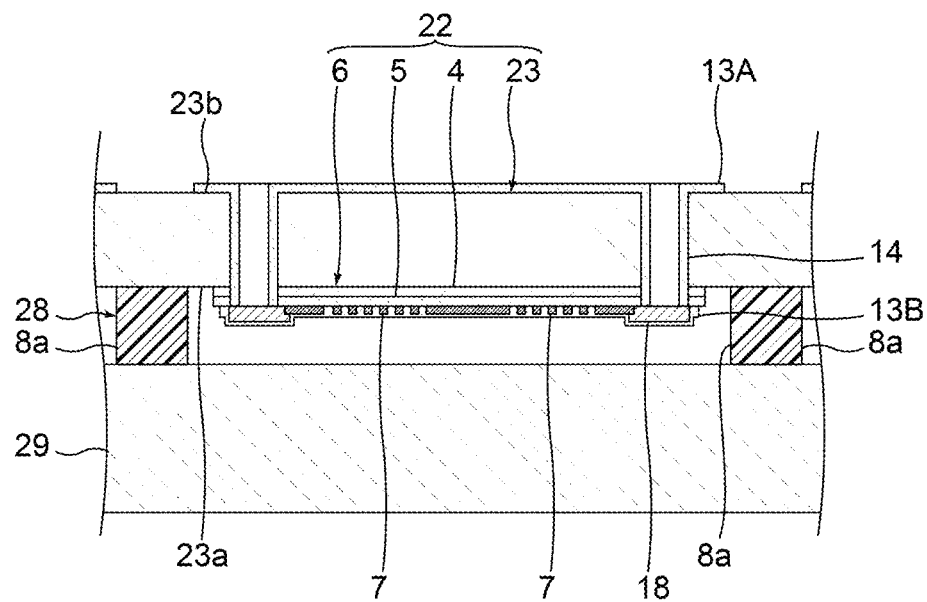
Figure 3A:
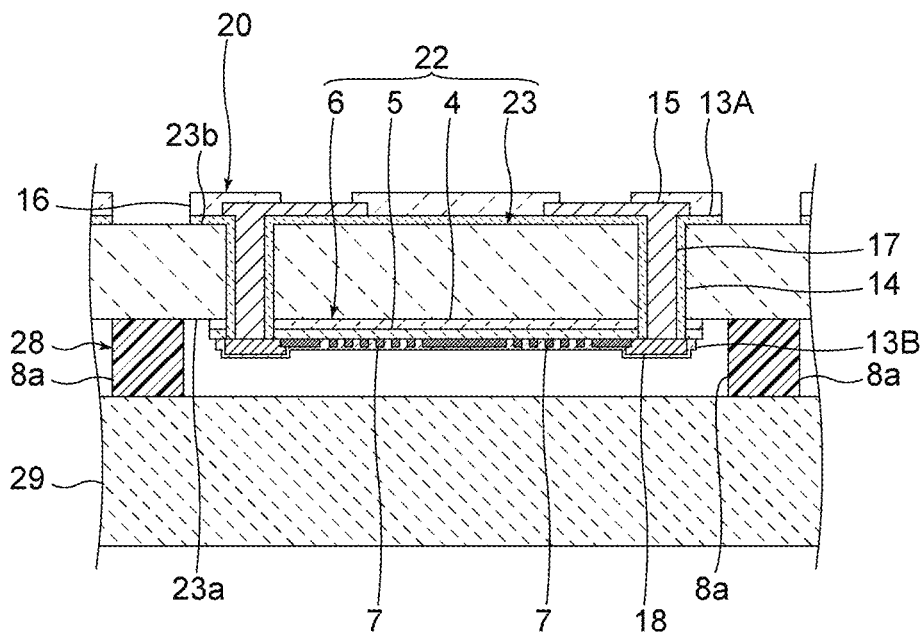
FIGS. 3A and 3B are elevational cross-sectional views showing an example of a method for manufacturing the acoustic wave device according to the first preferred embodiment of the present invention.
Figure 3B:
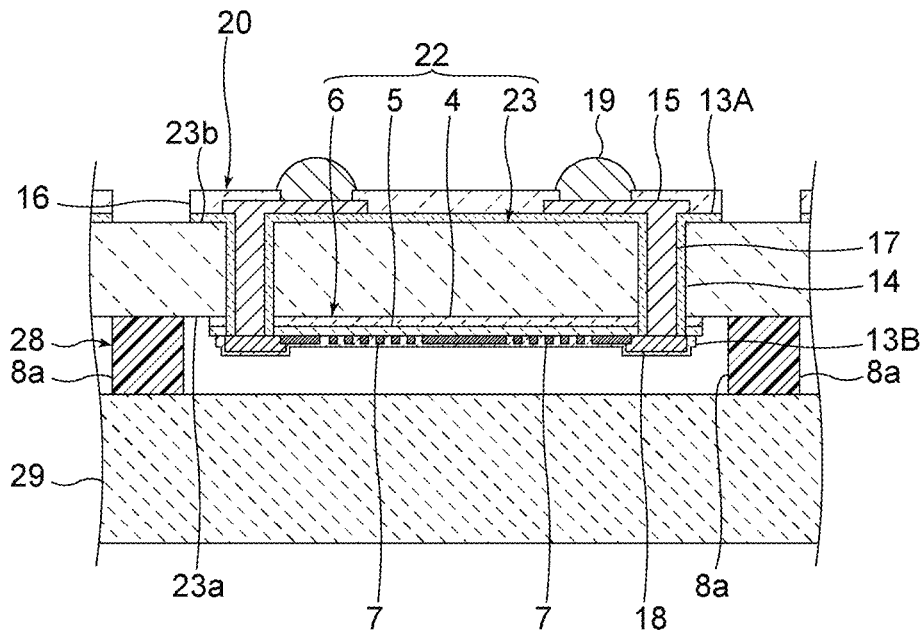
Figure 4:
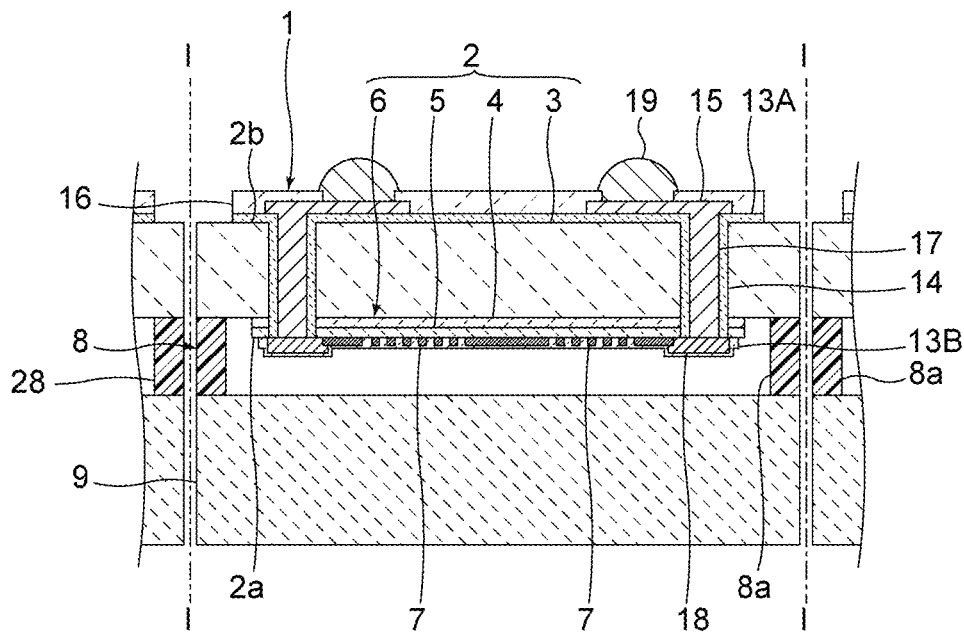
FIG. 4 is an elevational cross-sectional view showing an example of a method for manufacturing the acoustic wave device according to the first preferred embodiment of the present invention.

FIGS. 2A and 2B are elevational cross-sectional views showing an example of a method for manufacturing the acoustic wave device according to the first preferred embodiment. FIGS. 3A and 3B are elevational cross-sectional views showing an example of a method for manufacturing the acoustic wave device according to the first preferred embodiment. FIG. 4 is an elevational cross-sectional view showing an example of a method for manufacturing the acoustic wave device according to the first preferred embodiment.

As shown in FIG. 2A, an unseparated support substrate 23 including a third principal surface 23a and a fourth principal surface 23b facing each other is prepared. Next, a plurality of low acoustic velocity layers 4 are formed on the third principal surface 23a of the unseparated support substrate 23. For example, the low acoustic velocity layers 4 may be formed by sputtering or vacuum deposition. Next, a plurality of piezoelectric layers 5 are provided on the plurality of low acoustic velocity layers 4, respectively. A plurality of multilayer bodies each including the piezoelectric layer 5 and the low acoustic velocity layer 4 may be prepared separately and then provided on the unseparated support substrate 23. Thus, an unseparated piezoelectric substrate 22 is obtained.

Next, a plurality of IDT electrodes 7 and a plurality of second wiring electrodes 18 are formed on the plurality of piezoelectric layers 5, respectively. For example, the IDT electrodes 7 and the second wiring electrodes 18 may be formed by sputtering or vacuum deposition. The IDT electrodes 7 and the second wiring electrodes 18 may be patterned as appropriate by photolithography or the like, for example. Next, a plurality of second insulating layers 13B are formed on the plurality of piezoelectric layers 5 to cover the plurality of IDT electrodes 7 and the plurality of second wiring electrodes 18, respectively. For example, the second insulating layers 13B may be formed by sputtering or vacuum deposition. The second insulating layers 13B may be omitted.

Next, an unseparated support layer 28 including a plurality of cavities 8a is formed on the unseparated piezoelectric substrate 22. More specifically, the unseparated support layer 28 is formed on the third principal surface 23a of the unseparated support substrate 23 so that the plurality of cavities 8a accommodate the plurality of IDT electrodes 7, respectively. For example, the unseparated support layer 28 may be formed by photolithography or the like.

Next, an unseparated cover 29 is provided on the unseparated support layer 28 to seal the plurality of cavities 8a.

Next, a plurality of through holes 14 are formed through the unseparated support substrate 23, the low acoustic velocity layers 4, and the piezoelectric layers 5 as shown in FIG. 2B. The through holes 14 are formed up to the second wiring electrodes 18. For example, the through holes 14 may be formed by laser radiation. Alternatively, the through holes 14 may mechanically be formed by a drill or the like, for example.

Next, first insulating layers 13A are formed on the fourth principal surface 23b of the unseparated support substrate 23 and in the through holes 14. The first insulating layers 13A do not cover the entire second wiring electrodes 18. The first insulating layer 13A is preferably provided, for example, inside each cavity 8a of the unseparated support layer 28 when viewed in the direction normal or substantially normal to the second principal surface 2b. For example, the first insulating layers 13A may be formed by sputtering or vacuum deposition. The first insulating layers 13A on the second wiring electrodes 18 may be removed by etching or the like, for example. If the unseparated support substrate 23 is made of an insulator, the first insulating layers 13A may be omitted.

Next, as shown in FIG. 3A, through-via electrodes 17 are formed in the through holes 14 so that the through-via electrodes 17 are connected to the second wiring electrodes 18, respectively. Simultaneously, first wiring electrodes 15 are formed on the first insulating layers 13A. To form the through-via electrodes 17 and the first wiring electrodes 15, seed electrode layers are formed in the through holes 14 and on the first insulating layers 13A by, for example, sputtering or vacuum deposition. Next, the through-via electrodes 17 and the first wiring electrodes 15 are formed on the seed electrode layers by plating, for example. A process of forming the through-via electrodes 17 and the first wiring electrodes 15 is not limited to the process described above.

Next, a plurality of protective films 16 are formed on the fourth principal surface 23b of the unseparated support substrate 23 to cover a portion of the plurality of first wiring electrodes 15. More specifically, the protective films 16 are formed on the first wiring electrodes 15 to cover portions other than portions where bumps 19 will be provided in a step described later. The plurality of protective films 16 are each provided so that the protective film 16 does not extend to a portion overlapping the unseparated support layer 28 and is located on an inner side of the unseparated support layer 28 when viewed in a direction normal or substantially normal to the fourth principal surface 23b. More specifically, the plurality of protective films 16 are each provided so that the protective film 16 is located inside the cavity 8a of the unseparated support layer 28 when viewed in the direction normal or substantially normal to the fourth principal surface 23b. The direction normal or substantially normal to the fourth principal surface 23b is the same or substantially the same as the direction normal or substantially normal to the second principal surface 2b of the acoustic wave device 1 provided by this manufacturing process. For example, the protective films 16 may be formed by printing.

Through the process described above, an acoustic wave device aggregate 20 is able to be prepared. The acoustic wave device aggregate 20 includes the unseparated piezoelectric substrate 22, the plurality of IDT electrodes 7, the plurality of through-via electrodes 17, the plurality of first wiring electrodes 15, and the plurality of protective films 16. In the acoustic wave device aggregate 20, the unseparated support layer 28 is provided on the unseparated piezoelectric substrate 22 and the unseparated cover 29 is provided on the unseparated support layer 28. A method of preparing the acoustic wave device aggregate 20 is not limited to the method described above.

Next, as shown in FIG. 3B, the bumps 19 are provided on the first wiring electrodes 15 at the portions that are not covered with the protective films 16. The bumps 19 are able to be easily provided by providing the portions covered with the protective films 16 and the portions that are not covered with the protective films 16 on the first wiring electrodes 15.

Next, the unseparated piezoelectric substrate 22, the unseparated support layer 28, and the unseparated cover 29 are cut with a dicing machine along cutting lines represented by lines I-I as shown in FIG. 4. Thus, the acoustic wave device aggregate 20 is separated into individual pieces. In the first preferred embodiment, each protective film 16 does not extend to the portion overlapping the unseparated support layer 28 when viewed in the direction normal or substantially normal to the fourth principal surface 23b. Therefore, the protective films 16 are not cut even if the cutting positions vary as long as the portions including the unseparated support layer 28 are cut. Thus, the thickness of each portion to be cut is able to be significantly reduced. Accordingly, the time efficiency of the cutting step is able to be significantly increased and the productivity is able to be significantly increased.

In addition, in the first preferred embodiment, each first insulating layer 13A does not extend to the portion overlapping the unseparated support layer 28 when viewed in the direction normal or substantially normal to the fourth principal surface 23b. Therefore, the first insulating layers 13A are not cut with the dicing machine even if the cutting positions vary as long as the portions including the unseparated support layer 28 are cut. Thus, the deterioration of the electrical characteristics of the acoustic wave device 1 is able to be significantly reduced or prevented without a decrease in the time efficiency of the cutting step.

In the first preferred embodiment, the cutting is performed by laser radiation, for example. The cutting may be performed by etching or may mechanically be performed by a dicing wheel, for example.

A first insulating layer 13A having a thickness that does not impair the advantageous effects of the present invention may be provided at the portion overlapping the support layer 8 when viewed in the direction normal or substantially normal to the second principal surface 2b.

Figure 5:
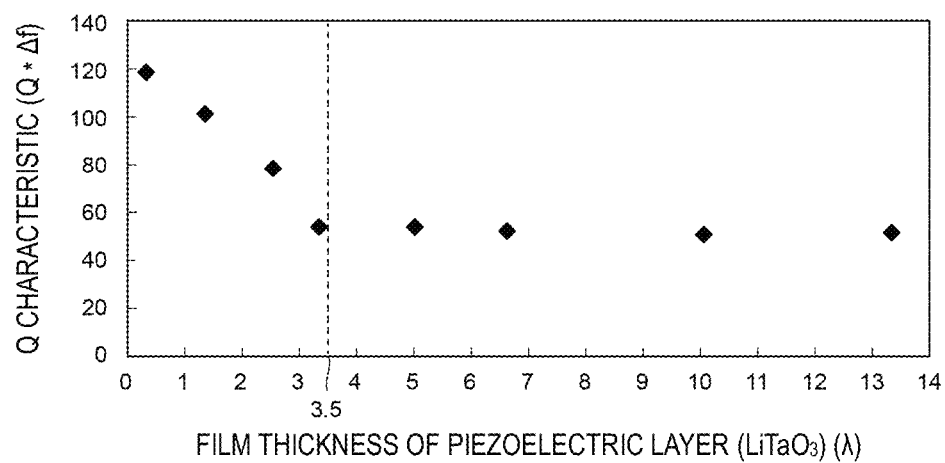
FIG. 5 is a diagram showing a relationship between the thickness of a piezoelectric layer and a Q characteristic.

When the piezoelectric substrate 2 has the multilayer structure as in the first preferred embodiment shown in FIG. 1, the piezoelectric layer 5 is a thin piezoelectric film and is thinner than a piezoelectric substrate included in a general acoustic wave device. A wavelength determined by an electrode finger pitch of the IDT electrode 7 is represented by $\lambda$. As shown in FIG. 5, a Q characteristic deteriorates when the thickness of the piezoelectric layer 5 is greater than about $3.5\lambda$. Therefore, the thickness of the piezoelectric layer 5 is preferably substantially equal to or smaller than about $3.5\lambda$, for example. Thus, the Q characteristic is able to be significantly improved.

The insulating layer may be provided between the support substrate and the first wiring electrode and between the support substrate and the through-via electrode. Accordingly, the leak current is able to be reduced if the support substrate is made of a semiconductor. Thus, the electrical characteristics of the acoustic wave device hardly deteriorate.

The insulating layer may be provided on the inner side of the support layer when viewed in the direction normal or substantially normal to the second principal surface. Accordingly, the productivity is able to be further significantly increased.

The thickness of the protective film may be greater than the thickness of the insulating layer. Accordingly, the damage to the first wiring electrode is further significantly reduced or prevented.

The support substrate may be the high acoustic velocity layer in which the acoustic velocity of the bulk wave propagating through the support substrate is higher than the acoustic velocity of the acoustic wave propagating through the piezoelectric layer. Accordingly, the energy of the acoustic wave is able to be effectively trapped on the piezoelectric layer side.

A high acoustic velocity layer in which an acoustic velocity of a bulk wave propagating through the high acoustic velocity layer is higher than the acoustic velocity of the acoustic wave propagating through the piezoelectric layer may be provided between the support substrate and the piezoelectric layer. Accordingly, the energy of the acoustic wave is able to be effectively trapped on the piezoelectric layer side.

The low acoustic velocity layer in which the acoustic velocity of the bulk wave propagating through the low acoustic velocity layer is lower than the acoustic velocity of the bulk wave propagating through the piezoelectric layer may be provided between the high acoustic velocity layer and the piezoelectric layer. Accordingly, the energy of the acoustic wave is able to be trapped on the piezoelectric layer side more effectively.

An acoustic reflection film may be provided between the support substrate and the piezoelectric layer. The acoustic reflection film may include a low acoustic impedance layer having a relatively low acoustic impedance and a high acoustic impedance layer having a relatively high acoustic impedance. Accordingly, the energy of the acoustic wave is able to be effectively trapped on the piezoelectric layer side.

The support substrate may be the silicon substrate.

The intermediate layer including at least one layer having insulating properties and also including the piezoelectric layer may be provided on the support substrate, and the second wiring electrode electrically connected to the IDT electrode may be provided on the intermediate layer. Accordingly, the leak current is able to be significantly reduced if the support substrate includes a semiconductor. Thus, the electrical characteristics of the acoustic wave device hardly deteriorate.

The second wiring electrode may be provided on the piezoelectric layer. Accordingly, the leak current is able to be significantly reduced if the support substrate includes a semiconductor. Thus, the electrical characteristics of the acoustic wave device hardly deteriorate.

The cover may be the silicon cover.

The first wiring electrode may have the portion that is not covered with the protective film. The bump may be provided on the first wiring electrode so that the bump is joined to the portion that is not covered with the protective film.

When the wavelength determined by the electrode finger pitch of the IDT electrode is represented by $\lambda$, the thickness of the piezoelectric layer may be substantially equal to or smaller than about $3.5\lambda$. Accordingly, the Q characteristic of the acoustic wave device is able to be significantly improved.

Modified Examples 1 to 3 of the first preferred embodiment are described below. In Modified Examples 1 to 3, the protective film 16 is provided similarly to the first preferred embodiment. Thus, the productivity is able to be significantly increased.

Figure 6:
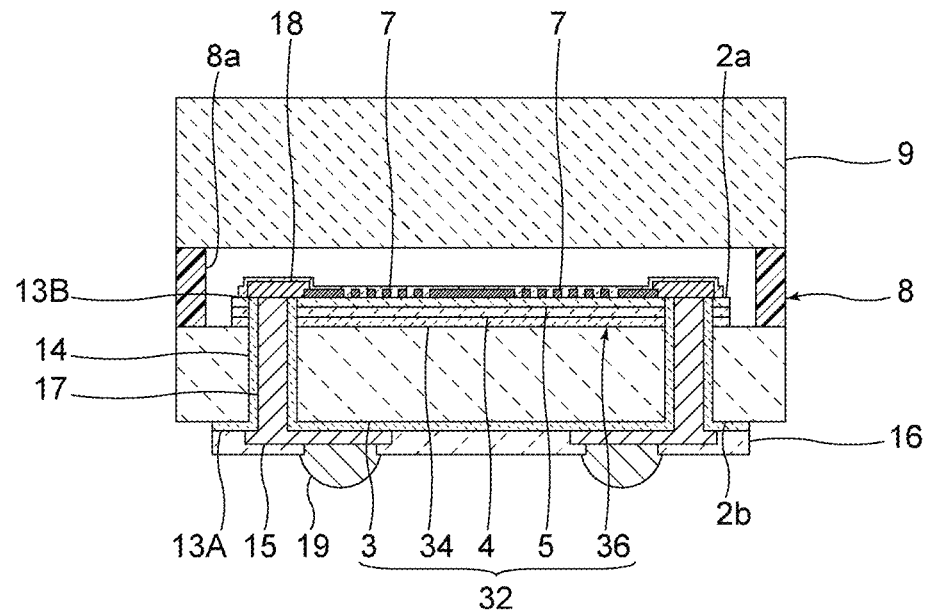
FIG. 6 is an elevational cross-sectional view of an acoustic wave device according to Modified Example 1 of the first preferred embodiment of the present invention.

FIG. 6 is an elevational cross-sectional view of an acoustic wave device according to Modified Example 1 of the first preferred embodiment.

Modified Example 1 differs from the first preferred embodiment in that a high acoustic velocity layer 34 is provided between the support substrate 3 and the piezoelectric layer 5 independently of the support substrate 3. The low acoustic velocity layer 4 is provided between the high acoustic velocity layer 34 and the piezoelectric layer 5. Except for the features described above, the acoustic wave device of Modified Example 1 has a structure similar to that of the acoustic wave device 1 of the first preferred embodiment. An intermediate layer 36 of Modified Example 1 includes the high acoustic velocity layer 34.

For example, the high acoustic velocity layer 34 is made of a piezoelectric material, for example, aluminum nitride, aluminum oxide, silicon carbide, silicon nitride, silicon oxynitride, a DLC film, silicon (Si), sapphire, lithium tantalate, lithium niobate, or quartz, various ceramics, for example, alumina, zirconia, cordierite, mullite, steatite, or forsterite, diamond, magnesia, a material including any material described above as a main component, or a material including a mixture of any materials described above as a main component. The material for the high acoustic velocity layer 34 may be any material having a relatively high acoustic velocity.

In Modified Example 2 as well, the high acoustic velocity layer 34, the low acoustic velocity layer 4, and the piezoelectric layer 5 are stacked in this order in a piezoelectric substrate 32. Thus, the energy of the acoustic wave is able to be effectively trapped on the piezoelectric layer 5 side.

Figure 7:
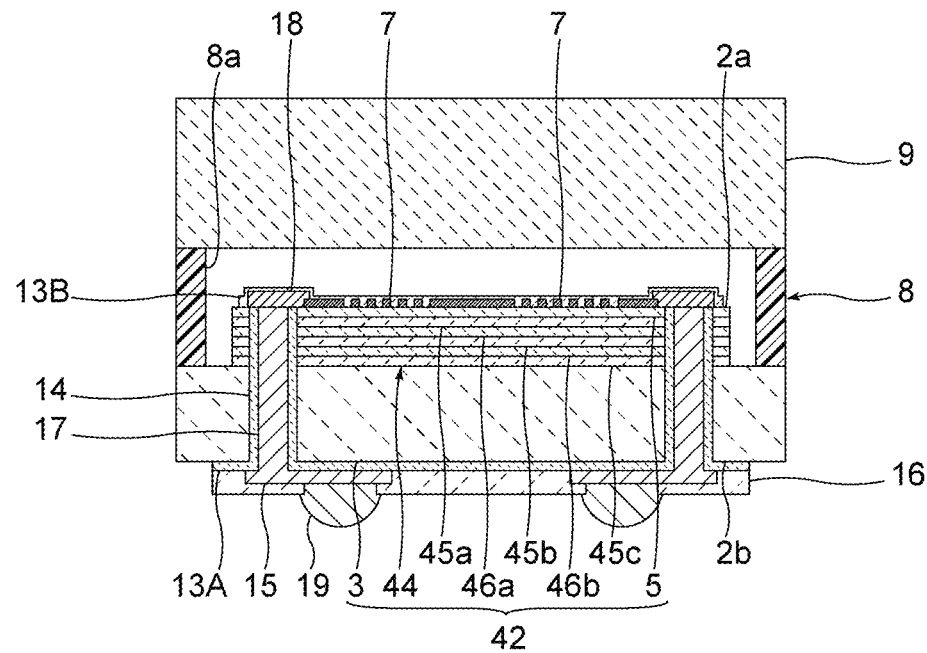
FIG. 7 is an elevational cross-sectional view of an acoustic wave device according to Modified Example 2 of the first preferred embodiment of the present invention.

FIG. 7 is an elevational cross-sectional view of an acoustic wave device according to Modified Example 2 of the first preferred embodiment.

Modified Example 2 differs from the first preferred embodiment in that an acoustic reflection film 44 is provided between the support substrate 3 and the piezoelectric layer 5. Except for the feature described above, the acoustic wave device of Modified Example 2 has a structure similar to that of the acoustic wave device 1 of the first preferred embodiment. An intermediate layer of Modified Example 2 includes the piezoelectric layer 5 and the acoustic reflection film 44.

The acoustic reflection film 44 includes a plurality of low acoustic impedance layers each having a relatively low acoustic impedance, and a plurality of high acoustic impedance layers each having a relatively high acoustic impedance. More specifically, the acoustic reflection film 44 includes three low acoustic impedance layers, which are a low acoustic impedance layer 45*a*, a low acoustic impedance layer 45*b*, and a low acoustic impedance layer 45*c*. The acoustic reflection film 44 includes two high acoustic impedance layers, which are a high acoustic impedance layer 46*a* and a high acoustic impedance layer 46*b*. In this modified example, the low acoustic impedance layers and the high acoustic impedance layers are stacked alternately. In the acoustic reflection film 44, the low acoustic impedance layer 45*a* is located closest to the piezoelectric layer 5.

In a piezoelectric substrate 42, the acoustic wave is able to be effectively reflected toward the piezoelectric layer 5 by providing the acoustic reflection film 44 between the piezoelectric layer 5 and the support substrate 3. Thus, the energy of the acoustic wave is able to be effectively trapped on the piezoelectric layer 5 side.

Figure 8:
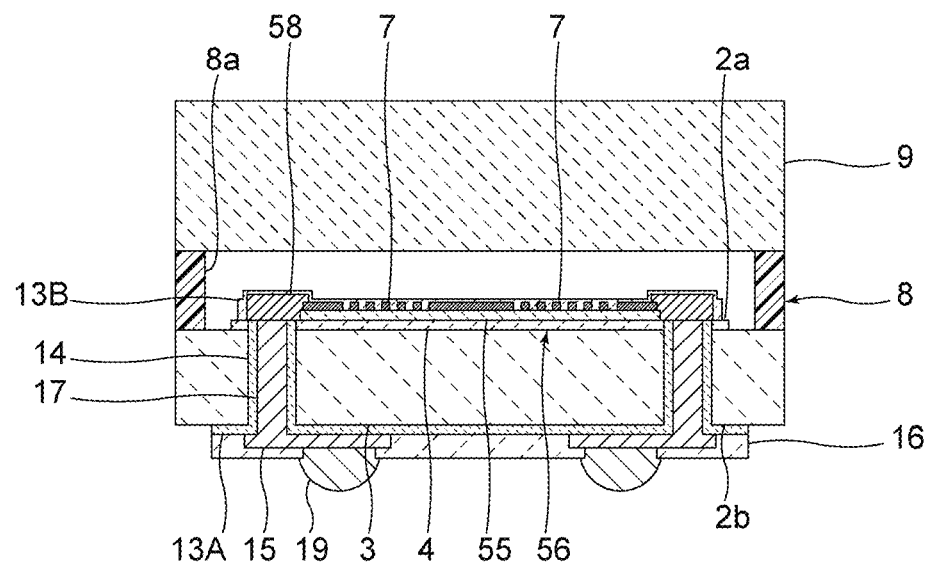
FIG. 8 is an elevational cross-sectional view of an acoustic wave device according to Modified Example 3 of the first preferred embodiment of the present invention.

FIG. 8 is an elevational cross-sectional view of an acoustic wave device according to Modified Example 3 of the first preferred embodiment.

Modified Example 3 differs from the first preferred embodiment in an arrangement of a piezoelectric layer 55 and second wiring electrodes 58 that extend to the low acoustic velocity layer 4. Except for the features described above, the acoustic wave device of Modified Example 3 has a structure similar to that of the acoustic wave device 1 of the first preferred embodiment. The piezoelectric layer 55 is provided on an inner side of the through-via electrodes 17 when viewed in the direction normal or substantially normal to the first principal surface 2*a*.

In Modified Example 3, preferably, the support substrate 3 is made of silicon and the low acoustic velocity layer 4 is made of silicon oxide similarly to the first preferred embodiment. The second wiring electrodes 58 are indirectly provided on the support substrate 3 with the low acoustic velocity layer 4 of an intermediate layer 56 interposed therebetween. Thus, the leak current is able to be significantly reduced and therefore the electrical characteristics of the acoustic wave device hardly deteriorate.

The acoustic wave device of the first preferred embodiment described above is able to be used as, for example, a duplexer of a high-frequency front end circuit. This example is described below.

Figure 9:
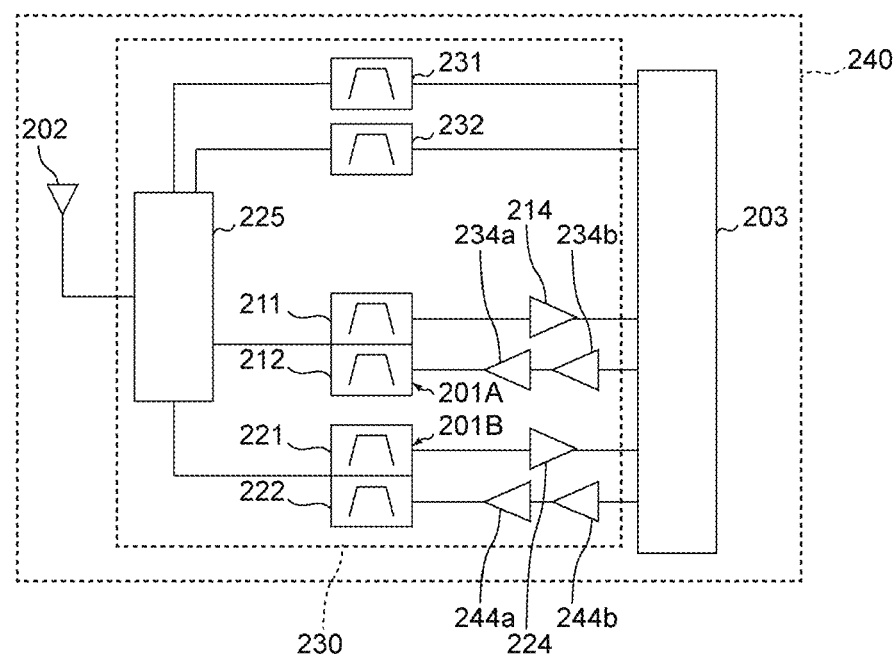
FIG. 9 is a structural diagram of a communication device including a high-frequency front end circuit according to a preferred embodiment of the present invention.

FIG. 9 is a structural diagram of a communication device and a high-frequency front end circuit. FIG. 9 also shows components connected to a high-frequency front end circuit 230, for example, an antenna element 202 and an RF signal processing circuit (RFIC) 203. The high-frequency front end circuit 230 and the RF signal processing circuit 203 define a communication device 240. The communication device 240 may include a power supply, a CPU, and a display.

The high-frequency front end circuit 230 includes a switch 225, duplexers 201A and 201B, filters 231 and 232, low-noise amplifier circuits 214 and 224, and power amplifier circuits 234*a*, 234*b*, 244*a*, and 244*b*. The high-frequency front end circuit 230 and the communication device 240 of FIG. 9 are examples of the high-frequency front end circuit and the communication device, and their structures are not limited to the structures described above.

The duplexer 201A includes filters 211 and 212. The duplexer 201B includes filters 221 and 222. The duplexers 201A and 201B are connected to the antenna element 202 with the switch 225 interposed therebetween. The acoustic wave device may be each of the duplexers 201A and 201B or each of the filters 211, 212, 221, and 222.

The acoustic wave device may also be applied to multiplexers having three or more filters, for example, a triplexer having a common antenna terminal for three filters and a hexaplexer having a common antenna terminal for six filters.

That is, the acoustic wave device includes an acoustic wave resonator, a filter, a duplexer, and a multiplexer having three or more filters. The structure of the multiplexer is not limited to a structure having both a transmission filter and a reception filter but may be a structure having the transmission filter or the reception filter alone.

For example, the switch 225 is preferably a SPDT (Single Pole Double Throw) switch that connects the antenna element 202 to a signal path associated with a predetermined band in response to a control signal from a controller (not shown). The number of signal paths to be connected to the antenna element 202 is not limited to one but may be plural. That is, the high-frequency front end circuit 230 may support carrier aggregation.

The low-noise amplifier circuit 214 is a reception amplifier circuit that amplifies a high-frequency signal (for example, a high-frequency reception signal) passing through the antenna element 202, the switch 225, and the duplexer 201A and output the high-frequency signal to the RF signal processing circuit 203. The low-noise amplifier circuit 224 is a reception amplifier circuit that amplifies a high-frequency signal (for example, a high-frequency reception signal) passing through the antenna element 202, the switch 225, and the duplexer 201B and output the high-frequency signal to the RF signal processing circuit 203.

The power amplifier circuits 234*a* and 234*b* are transmission amplifier circuits that amplify a high-frequency signal (for example, a high-frequency transmission signal) output from the RF signal processing circuit 203 and output the high-frequency signal to the antenna element 202 via the duplexer 201A and the switch 225. The power amplifier circuits 244*a* and 244*b* are transmission amplifier circuits that amplify a high-frequency signal (for example, a high-frequency transmission signal) output from the RF signal processing circuit 203 and output the high-frequency signal to the antenna element 202 via the duplexer 201B and the switch 225.

The RF signal processing circuit 203 performs signal processing, for example, down-conversion for a high-frequency reception signal input from the antenna element 202 via a reception signal path and outputs a reception signal generated through the signal processing. The RF signal processing circuit 203 also performs signal processing, for example, up-conversion for an input transmission signal and outputs a high-frequency transmission signal generated through the signal processing to the power amplifier circuits 234*a*, 234*b*, 244*a*, and 244*b*. For example, the RF signal processing circuit 203 is an RFIC. The communication device may include a BB (baseband) IC. Accordingly, the BBIC performs signal processing for a reception signal processed by the RFIC. The BBIC also performs signal processing for a transmission signal and outputs the transmission signal to the RFIC. For example, the reception signal processed by the BBIC and the transmission signal to be processed by the BBIC are image signals or audio signals.

In place of the duplexers 201A and 201B, the high-frequency front end circuit 230 may include duplexers according to modified examples of the duplexers 201A and 201B.

The filters 231 and 232 of the communication device 240 are connected between the RF signal processing circuit 203 and the switch 225 on a signal path that does not include the low-noise amplifier circuits 214 and 224 and the power amplifier circuits 234a, 234b, 244a, and 244b. The filters 231 and 232 are connected to the antenna element 202 with the switch 225 interposed therebetween similarly to the duplexers 201A and 201B.

According to the high-frequency front end circuit 230 and the communication device 240 having the structures described above, the productivity is able to be further significantly increased by, for example, the acoustic wave resonator, the filter, the duplexer, and the multiplexer having three or more filters, each of which is the acoustic wave device of the present invention.

Although the acoustic wave devices, the high-frequency front end circuits, and the communication devices according to preferred embodiments of the present invention have been described above based on a preferred embodiment and modified examples thereof, the present invention encompasses other preferred embodiments obtained by combining arbitrary components of the preferred embodiment and the modified examples described above, modified examples provided by various modifications conceivable by persons skilled in the art to the preferred embodiment described above without departing from the spirit of the present invention, and various devices including the high-frequency front end circuit and the communication device according to the present invention.

The present invention is widely applicable to a mobile phone or other communication equipment as an acoustic wave resonator, a filter, a duplexer, a multiplexer applicable to multi-band systems, a front end circuit, and a communication device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:
    a piezoelectric substrate including a support substrate and a piezoelectric layer directly or indirectly provided on the support substrate, the piezoelectric substrate including a first principal surface on the piezoelectric layer side, and a second principal surface on the support substrate side;
    an interdigital transducer (IDT) electrode directly or indirectly provided on the first principal surface of the piezoelectric substrate;
    a support layer provided on the support substrate to surround the IDT electrode when viewed in a direction normal or substantially normal to the first principal surface;
    a cover provided on the support layer;
    a through-via electrode provided through the support substrate and electrically connected to the IDT electrode;
    a first wiring electrode provided on the second principal surface of the piezoelectric substrate and electrically connected to the through-via electrode; and
    a protective film covering at least a portion of the first wiring electrode; wherein
    the protective film is provided on an inner side of the support layer so that the protective film does not overlap the support layer when viewed in a direction normal or substantially normal to the second principal surface.

2. The acoustic wave device according to claim 1, wherein an insulating layer is provided between the support substrate and the first wiring electrode and between the support substrate and the through-via electrode.

3. The acoustic wave device according to claim 2, wherein the insulating layer is provided on an inner side of the support layer when viewed in the direction normal or substantially normal to the second principal surface.

4. The acoustic wave device according to claim 2, wherein a thickness of the protective film is greater than a thickness of the insulating layer.

5. The acoustic wave device according to claim 1, wherein the support substrate is a high acoustic velocity layer in which an acoustic velocity of a bulk wave propagating through the support substrate is higher than an acoustic velocity of an acoustic wave propagating through the piezoelectric layer.

6. The acoustic wave device according to claim 1, wherein a high acoustic velocity layer in which an acoustic velocity of a bulk wave propagating through the high acoustic velocity layer is higher than an acoustic velocity of an acoustic wave propagating through the piezoelectric layer is provided between the support substrate and the piezoelectric layer.

7. The acoustic wave device according to claim 5, wherein a low acoustic velocity layer in which an acoustic velocity of a bulk wave propagating through the low acoustic velocity layer is lower than an acoustic velocity of a bulk wave propagating through the piezoelectric layer is provided between the high acoustic velocity layer and the piezoelectric layer.

8. The acoustic wave device according to claim 1, wherein
    an acoustic reflection film is provided between the support substrate and the piezoelectric layer; and
    the acoustic reflection film includes a low acoustic impedance layer having a relatively low acoustic impedance and a high acoustic impedance layer having a relatively high acoustic impedance.

9. The acoustic wave device according to claim 1, wherein the support substrate is a silicon substrate.

10. The acoustic wave device according to claim 1, wherein
    an intermediate layer including at least one layer having insulating properties and also including the piezoelectric layer is provided on the support substrate; and
    a second wiring electrode electrically connected to the IDT electrode is provided on the intermediate layer.

11. The acoustic wave device according to claim 10, wherein the second wiring electrode is provided on the piezoelectric layer.

12. The acoustic wave device according to claim 1, wherein the cover is a silicon cover.

13. The acoustic wave device according to claim 1, wherein
    the first wiring electrode includes a portion that is not covered with the protective film; and
    a bump is provided on the first wiring electrode so that the bump is joined to the portion that is not covered with the protective film.

14. The acoustic wave device according to claim 1, wherein, when a wavelength determined by an electrode finger pitch of the IDT electrode is represented by λ, a thickness of the piezoelectric layer is equal to or smaller than about 3.5λ.

15. A high-frequency front end circuit, comprising:
   the acoustic wave device according to claim 1; and
   a power amplifier.

16. A communication device, comprising:
   the high-frequency front end circuit according to claim 15; and
   an RF signal processing circuit.

17. A method for manufacturing the acoustic wave device according to claim 1, the method comprising:
   a step of preparing an acoustic wave device aggregate including an unseparated piezoelectric substrate, a plurality of the IDT electrodes, a plurality of the through-via electrodes, a plurality of the first wiring electrodes, a plurality of the protective films, an unseparated support layer provided on the unseparated piezoelectric substrate to surround the plurality of the IDT electrodes, and an unseparated cover provided on the unseparated support layer; and
   a step of separating the acoustic wave device aggregate into individual pieces by cutting the unseparated piezoelectric substrate, the unseparated support layer, and the unseparated cover with a dicing machine; wherein
   the step of preparing the acoustic wave device aggregate includes providing the plurality of the protective films so that each of the protective films does not extend to a portion overlapping the unseparated support layer and is located on an inner side of the unseparated support layer when viewed in the direction normal or substantially normal to the second principal surface.

18. The method for manufacturing the acoustic wave device according to claim 17, wherein the step of separating the acoustic wave device aggregate into individual pieces includes performing the cutting by laser radiation.

19. The acoustic wave device according to claim 1, wherein the IDT electrode is provided in a hollow space surrounded by the support substrate, the support layer, and the cover.

20. The acoustic wave device according to claim 10, wherein an insulating layer is provided to cover IDT electrode and the second wiring electrode.

\* \* \* \* \*